US010965223B2

(12) United States Patent
Wischnewskiy et al.

(10) Patent No.: US 10,965,223 B2
(45) Date of Patent: Mar. 30, 2021

(54) ULTRASONIC MOTOR WITH THERMAL COMPENSATION PLATFORM

(71) Applicant: Physik Instrumente (PI) GmbH & Co. KG, Karlsruhe (DE)

(72) Inventors: Wladimir Wischnewskiy, Rathenow (DE); Alexej Wischnewski, Wörth (DE)

(73) Assignee: PHYSIK INSTRUMENTE (PI) GMBH & CO. KG, Karlsruhe (DE)

( * ) Notice: Subject to any disclaimer, the term of this patent is extended or adjusted under 35 U.S.C. 154(b) by 297 days.

(21) Appl. No.: 16/309,327

(22) PCT Filed: Jun. 9, 2017

(86) PCT No.: PCT/DE2017/100488
§ 371 (c)(1),
(2) Date: Dec. 12, 2018

(87) PCT Pub. No.: WO2017/215704
PCT Pub. Date: Dec. 21, 2017

(65) Prior Publication Data
US 2019/0273450 A1 Sep. 5, 2019

(30) Foreign Application Priority Data
Jun. 13, 2016 (DE) ...................... 10 2016 110 771.9

(51) Int. Cl.
*H02N 2/02* (2006.01)
*H02N 2/00* (2006.01)
(Continued)

(52) U.S. Cl.
CPC ............. *H02N 2/026* (2013.01); *H02N 2/006* (2013.01); *H02N 2/009* (2013.01);
(Continued)

(58) Field of Classification Search
CPC .... H02N 2/026; H02N 2/0055; H02N 2/0065; H02N 2/103; H02N 2/006; H02N 2/009; H01L 41/0986
See application file for complete search history.

(56) References Cited

U.S. PATENT DOCUMENTS 7,126,259 B2 10/2006 Moler et al.
7,911,112 B2 3/2011 Adachi et al.
(Continued)

FOREIGN PATENT DOCUMENTS

CN 1902767 A 1/2007
CN 101160710 A 4/2008
(Continued)

OTHER PUBLICATIONS

Office Action (Notification of the First Office Action) dated Sep. 4, 2019, by the State Intellectual Property Office of P.R.C., in corresponding Chinese Patent Application No. 201780036605.8, and an English Translation of the Office Action.(12 pages).
(Continued)

*Primary Examiner* — Emily P Pham
(74) *Attorney, Agent, or Firm* — Buchanan Ingersoll & Rooney PC (57) ABSTRACT

An ultrasonic motor includes an actuator with a piezoelectric plate, at least one friction element, an element to be driven in active contact with the friction element, a tensioning device for pressing the friction element against the element to be driven, and a thermo-compensation platform having abutting sections by which displacement of the actuator is only possible along abutting side surfaces of the piezo-electric plate. The tensioning device includes two rotation angle levers of which two tension lever arms are connected to one another via a tensioned tension spring, to exert torque on the rotation angle lever such that pressure lever arms will act on the actuator to be linearly guided by (Continued)

the abutting sections in the direction of the element to be driven.

17 Claims, 12 Drawing Sheets

(51) Int. Cl.
    *H02N 2/10* (2006.01)
    *H01L 41/09* (2006.01)
(52) U.S. Cl.
    CPC ......... *H02N 2/0055* (2013.01); *H02N 2/0065* (2013.01); *H01L 41/0986* (2013.01); *H02N 2/103* (2013.01)

(56) References Cited

U.S. PATENT DOCUMENTS

| | | |
|---|---|---|
| 9,136,778 B2 | 9/2015 | Petrenko et al. |
| 2005/0146248 A1 | 7/2005 | Moler et al. |
| 2006/0017349 A1 | 1/2006 | Moler et al. |
| 2009/0026884 A1 | 1/2009 | Adachi et al. |
| 2014/0246955 A1* | 9/2014 | Rosenkranz ........... H02N 2/026 310/354 |
| 2015/0042209 A1* | 2/2015 | Wischenwskiy ....... H02N 2/007 310/323.16 |
| 2016/0036352 A1 | 2/2016 | Hubner |
| 2018/0358909 A1* | 12/2018 | Philips .................. H02N 2/001 |

FOREIGN PATENT DOCUMENTS

| | | |
|---|---|---|
| CN | 105048863 A | 11/2015 |
| EP | 2258004 B1 | 1/2012 |
| JP | 4043497 B2 | 11/2007 |
| WO | 2014135675 A1 | 9/2014 |

OTHER PUBLICATIONS

Office Action (Notification of the Second Office Action) dated May 29, 2020, by the State Intellectual Property Office of China in corresponding Chinese Patent Application No. 201780036605.8, and an English Translation of the Office Action. (11 pages).

International Search Report (PCT/ISA/210) dated Sep. 19, 2017, by the German Patent Office as the International Searching Authority for International Application No. PCT/DE2017/100488.

* cited by examiner

ULTRASONIC MOTOR WITH THERMAL COMPENSATION PLATFORM

The invention relates to an ultrasonic motor according to claim 1.

From EP 2 200 101 A1, an ultrasonic motor is known in which the ultrasonic actuator is held by means of a plurality of springs, one of which acts substantially parallel to the direction of movement of the element to be driven. In this known ultrasonic motor, a displacement of the ultra-sonic actuator occurs at the beginning of the movement of the element to be driven and also at the moment of stopping the movement, which reduces the positioning accuracy of the element to be driven.

Furthermore, from EP 2 258 004 B1, an ultrasonic motor is known in which the ultrasonic actuator is held on two of its side surfaces by limit stops. The limit stops effectively prevent the actuator from being displaced during start and stop of the element to be driven. Pressing the friction element against the element to be driven is carried out here—similar to the EP 2 200 101 A 1 cited above—by means of two independent springs acting on one side surface of the actuator. However, by using two independent springs, it is not possible to ensure exactly the same contact pressure on each of the actuator sides, which interferes with the symmetry of the motor operation when the element to be driven moves in the two drive directions that are opposite to one another.

Therefore, the objective technical problem of the invention is to provide an ultrasonic motor which enables symmetrical motor operation with respect to the drive directions and thus achieves increased positioning accuracy.

This problem is solved by an ultrasonic motor according to claim 1, wherein the subsequent dependent claims at least constitute expedient further embodiments.

Accordingly, an ultrasonic motor is assumed which comprises an actuator in the form of a piezo-electric plate with two main surfaces having the largest areas and at least four side surfaces connecting the main surfaces with one another, at least one friction element being arranged on at least one of the side surfaces. Furthermore, the ultrasonic motor comprises an element to be driven which is in active contact with the friction element of the actuator and is driven via the same, a tensioning device for pressing the at least one friction element against the element to be driven; and a thermo-compensation platform having abutting sections against which the associated side surfaces of the actuator abut so that a displacement of the actuator is only possible along the abutting side surfaces.

The ultrasonic motor according to the invention is in particular characterized in that the tensioning device has two rotatably mounted rotation angle levers, wherein each rotation angle lever comprises a pressure lever arm and a tension lever arm, and the two pressure lever arms are connected to one another via a tensioned tension spring, such that a tensile force is exerted on each of the rotation angle levers. This tensile force of the tension spring which acts on a distal section of the respective tension lever arm introduces a torque into the angle of rotation levers in such a way that each of the pressure lever arms acts with a defined force on that side surface of the actuator which is opposite to the side surface on which the at least one friction element is arranged so that the actuator is pressed along the abutting sections and linearly guided by them in the direction of the element to be driven.

It may be advantageous that the length of the thermo-compensation platform and its material are selected such that its temperature-related change in length is equal to the sum of the temperature-related change in length of the piezo-electric plate and the temperature-related change in width of the abutting sections so that the actuator is substantially free of compression forces when the temperature changes. The term "change in length" refers to the change in dimension in the direction of or along the largest geometric extension of the thermo-compensation platform and the piezo-electric plate, namely its length. The term "change in width", on the other hand, refers to the change in dimension in a direction perpendicular to the largest geometric extension of the abutting sections. This direction substantially coincides with the length direction of the thermo-compensation platform and the piezo-electric plate.

It may also be advantageous that each of the abutting sections has one base section and two wing sections, each with a free end, against which the actuator abuts with its corresponding or associated side surface, wherein the wing sections are connected to the base section via a connecting web, preferably via a common connecting web.

In addition, it may be advantageous that each of the abutting sections has a base section and two wall sections against which the actuator abuts with its corresponding or associated side surface, each of the wall sections being connected to the base section via at least one connecting web, preferably via a common connecting web, and a fastening web.

Furthermore, it may be advantageous that the resonant frequency Fs of at least one wing section or at least one wall section is equal to or greater than the operating frequency Fa of the actuator.

In addition, it may be advantageous that the actuator is arranged with respect to the abutting sections in such a way that each connecting web and/or each fastening web is located in the range of the respective velocity minimum of the deformation vibrations generated on the respective side surface of the actuator during operation.

In addition, it may be advantageous that the actuator is arranged with respect to the rotation angle levers in such a way that the respective point of contact between one of the pressure lever arms and the actuator is in the range of the respective velocity minimum of the deformation vibrations generated on the respective side surface of the actuator during operation.

With the above-mentioned advantageous arrangements of the actuator, said actuator experiences the least interferences with respect to or the least influence on the deformation vibrations induced in it during its operation so that a high efficiency of the actuator results.

It is shown in.

In the following, the terms "ultrasonic motor" and "motor" are used synonymously. The same applies for the terms "ultrasonic actuator" and "actuator" or "thermo-compensation platform" and "platform".

Figure 1:
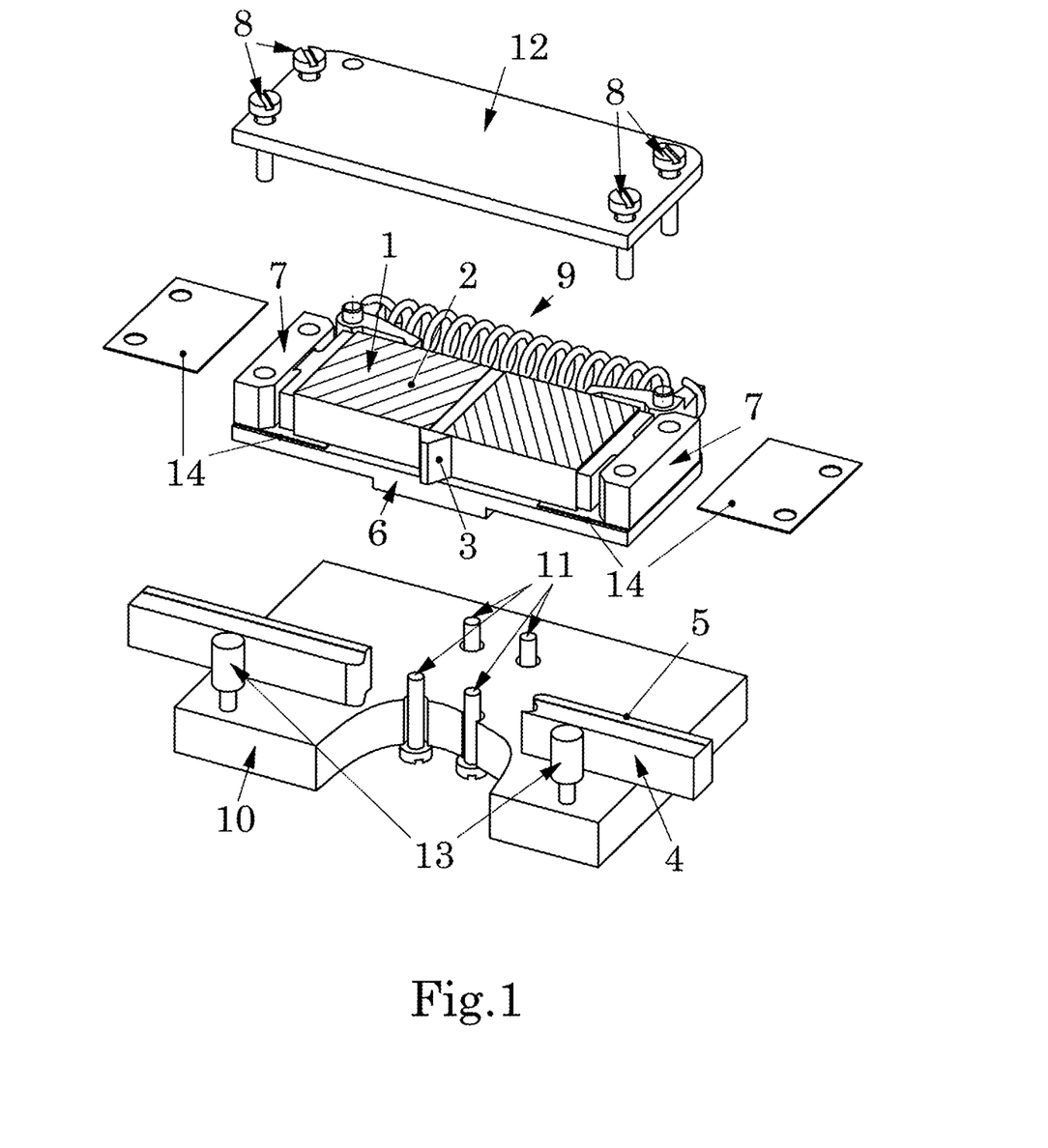
FIG. 1: an exploded view of an embodiment of an ultrasonic motor according to the invention

FIG. 1 shows an embodiment of an ultrasonic motor according to the invention for a linear movement. In this case, the ultrasonic motor comprises an ultrasonic actuator 1 in the form of a rectangular piezo-electric plate 2 with two main surfaces of the largest area and four side surfaces connecting the two main surfaces with one another. A friction element 3 is arranged on one of the side surfaces and is provided for friction contact with a friction layer 5 of a rod-shaped element to be driven 4. It should be noted that in FIG. 1, the element to be driven 4 is shown with an interruption.

The ultrasonic motor further comprises a thermo-compensation platform 6 with abutting sections 7 on which the actuator is supported with its corresponding or associated side surfaces and the actuator is guided linearly through the abutting sections. The abutting sections 7 are fastened to the thermo-compensation platform 6 by means of screws 8, while the thermo-compensation platform 6 itself is mounted on the motor or device housing 10 by means of fastening elements 11. The friction element 3 is pressed against the friction layer 5 of the element to be driven 4 by means of the tensioning device 9. A possible transverse displacement of the actuator 1, i.e. a displacement along the surface normal of the main surfaces, is prevented or limited by the cover 12. The element to be driven 4 is movably supported by bearings 13 arranged on the housing 10. Insulating intermediate bearings 14 electrically and/or acoustically insulate the actuator 1 from the platform 6 or from the cover 12.

Figure 2:
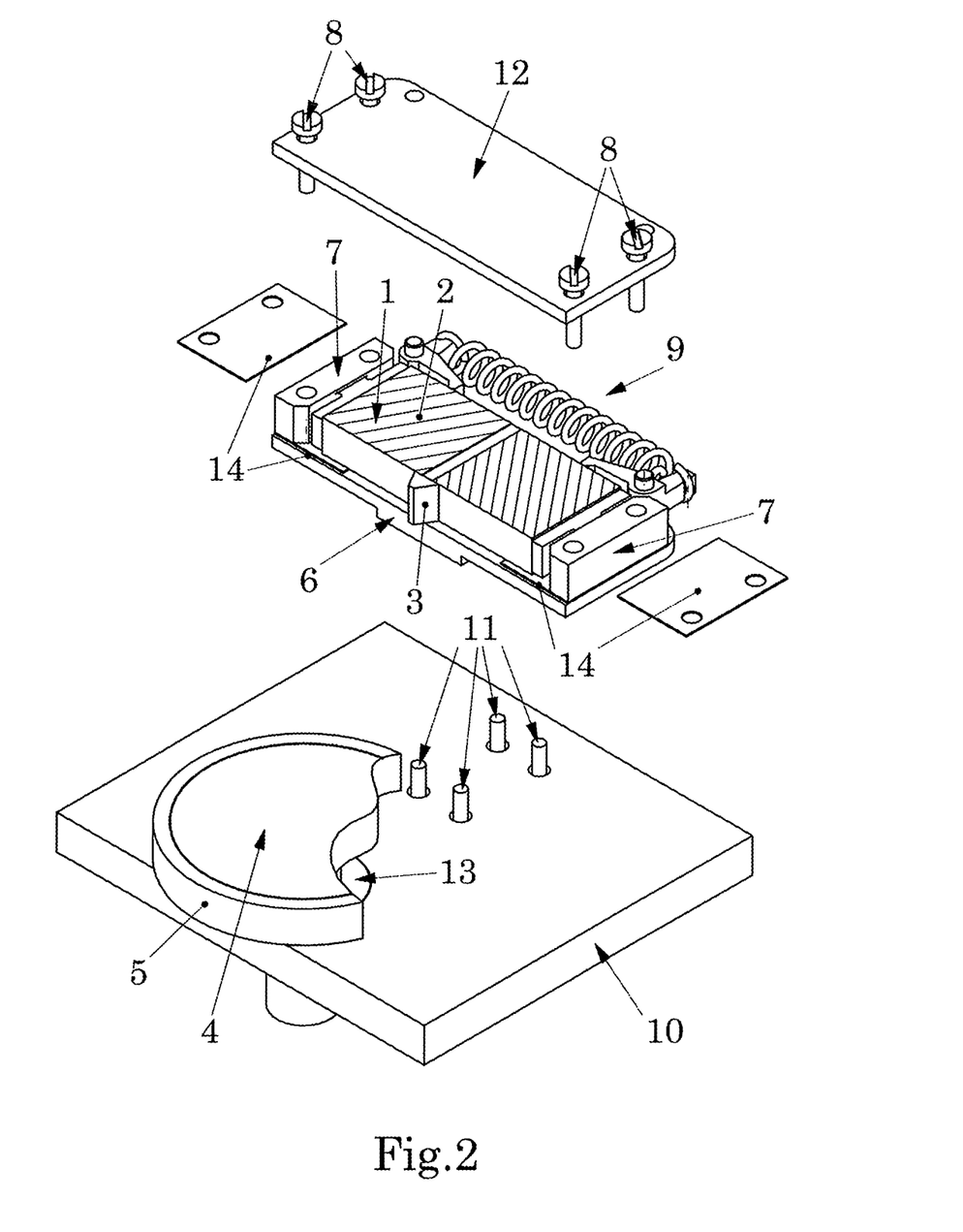
FIG. 2: an exploded view of a further embodiment of an ultrasonic motor according to the invention

FIG. 2 shows a possible embodiment of an ultrasonic motor according to the invention for a rotation movement, in which the element to be driven 4 is configured as a round disc. Other embodiments of the element to be driven, for example, in the form of a cylinder or a shaft, are also conceivable.

Figure 3:
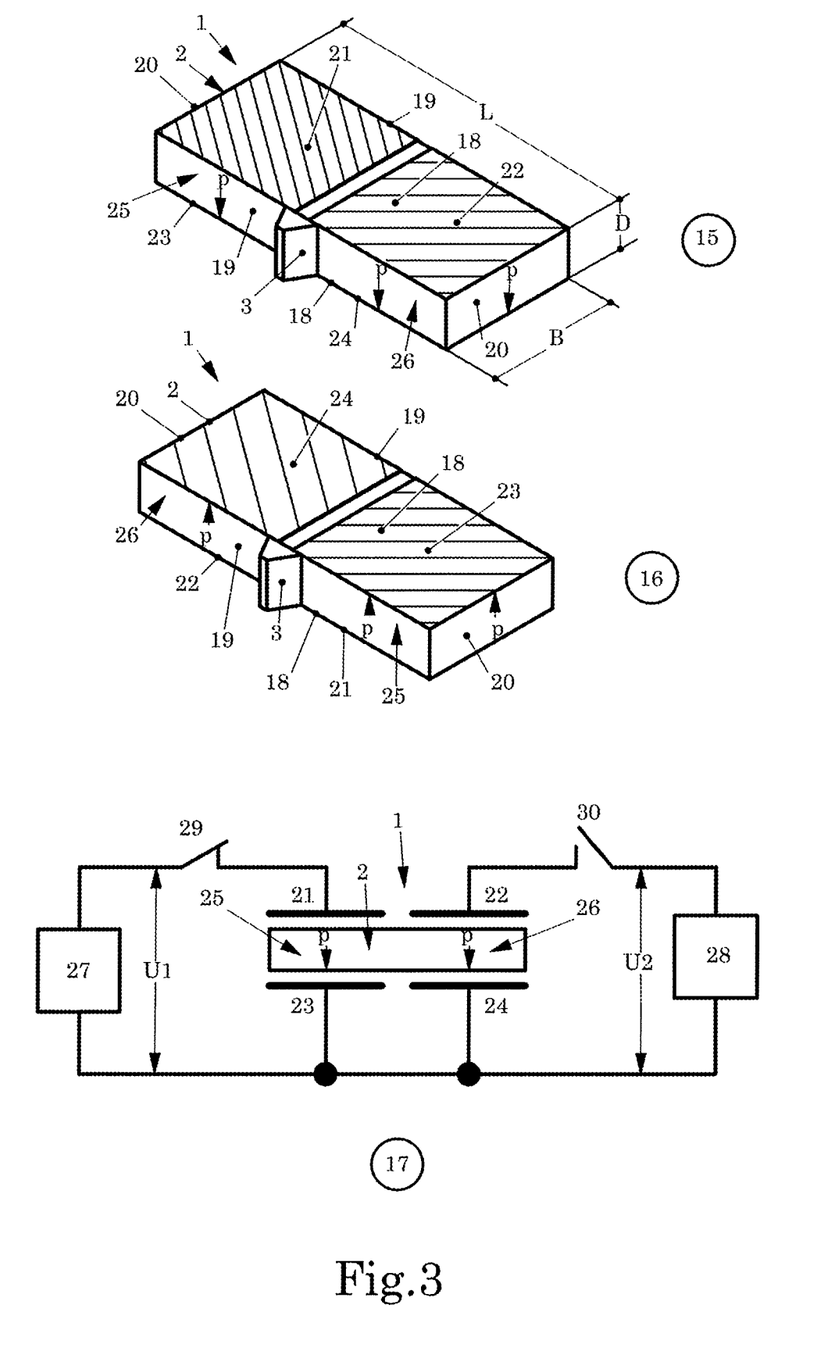
FIG. 3: illustration 15: front side view of an actuator of an ultrasonic motor according to the invention; illustration 16: rear side view of the actuator according to illustration 15; illustration 17: block diagram for illustrating a possible connection of the actuator according to illustrations 15 and 16 in an ultrasonic motor according to the invention with an electric excitation device

Illustrations 15 and 16 of FIG. 3 show the front or upper side and the rear or lower side of an actuator 1 of an ultrasonic motor according to the invention. The piezo-electric plate 2 of the actuator 1 exhibits the main surfaces 18 and the side surfaces 19 and 20. The piezo-electric plate 2 also exhibits the length L, the width B, and the thickness D. The excitation electrodes 21, 22 and the general electrodes 23, 24 are located on the main surfaces 18. The general electrodes 23 and 24 can thereby be configured as a common electrode. The electrode pairs 21, 23 and 22, 24 with the piezo-ceramic material arranged between them form the generators for the acoustic standing waves 25 and 26. The generators 25, 26 can also be realized in the form of multilayer structures in which the layers of the electrodes 21, 23 and 22, 24 and the piezo-ceramic layers are arranged alternately beneath one another (not shown in FIG. 3). The friction element 3 is arranged on one of the side surfaces 19 of the plate 2 of the actuator 1. According to illustration 17 of FIG. 3 which shows a block diagram of a possible drive variant of the actuator according to illustrations 15 and 16, the actuator 1 is electrically connected to an electric excitation device comprising a generator 27 for the electrically alternating voltage U1 and a generator 28 for the electrically alternating voltage U2, the alternating voltages U1 and U2 having the same frequency corresponding to the operating frequency Fa of the actuator 1. Applying the voltage U1 and U2 to actuator 1 is carried out via switches 29 and 30.

Depending on the desired operating mode of the actuator, only voltage U1 or voltage U2 can be applied to the electrodes 21 and 23 or 22 and 24 of the generators 25 and 26. In this case, only one acoustic standing wave is generated in the actuator 1 with the generators 25 and 26. The length of the generated waves is approximately equal to the length of the piezo-electric plate L of the actuator 1. This means that the second mode of the acoustic wave is generated in the actuator 1. In addition, the two voltages U1 and U1 can be applied to the electrodes 21, 23 and 22, 24. In this case, two phase-shifted acoustic standing waves of length L are generated in the actuator 1 with the generators 25 and 26. The electric excitation device can also consist of only one generator 27 for the electrical voltage U1. This voltage can be applied to the electrodes 21 and 23 of the generator 25 or to the electrodes 22 and 24 of the generator 26.

Figure 4:
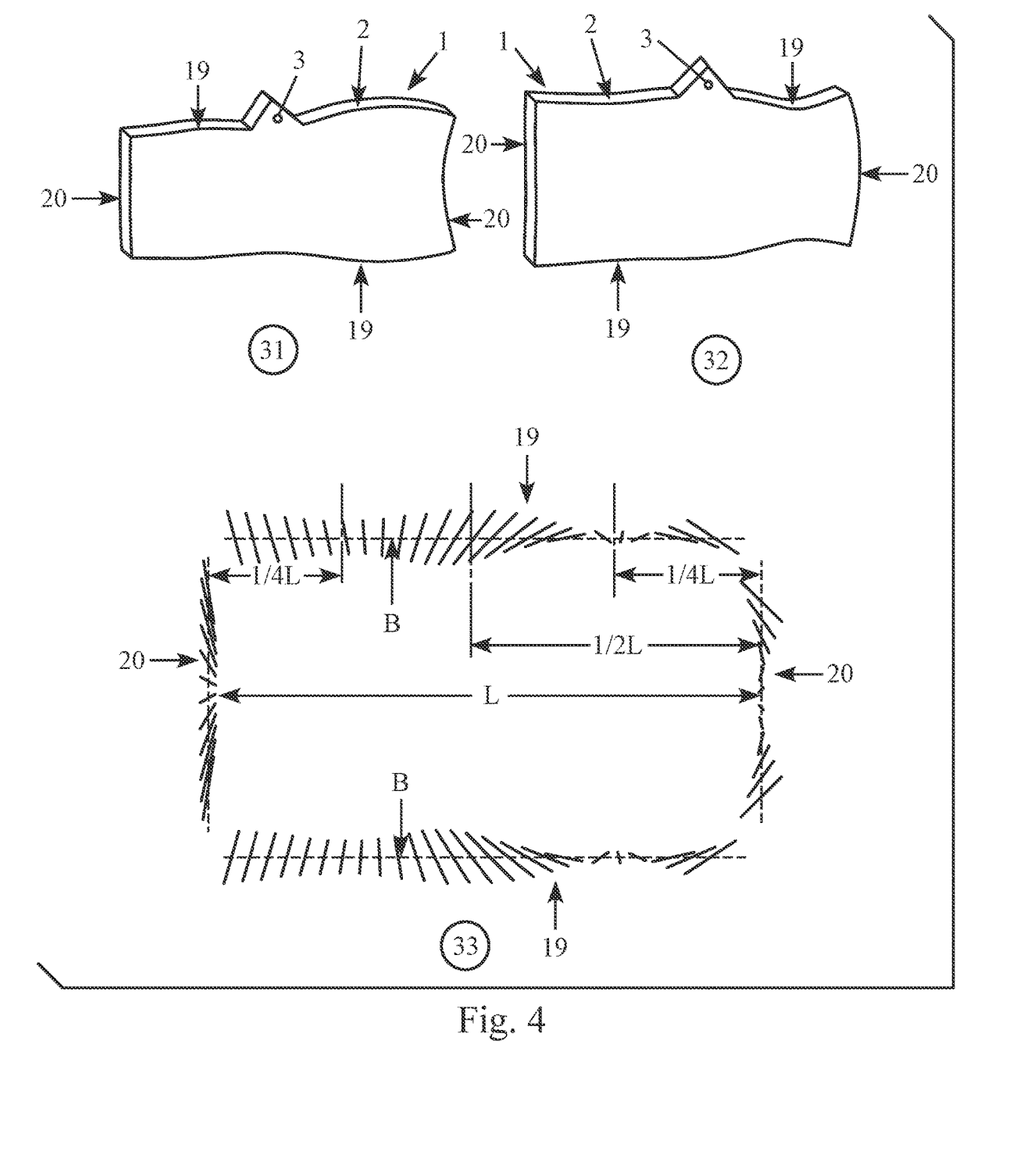
FIG. 4: illustrations 31 and 32: calculated deformation states of an actuator of an ultrasonic motor according to the invention; illustration 33: calculated trajectories of the side surface points of an actuator of an ultrasonic motor according to the invention

If an acoustic standing wave with its operating frequency Fa is generated in the actuator 1, the actuator 1 oscillates according to the manner shown in illustrations 31 and 32 of FIG. 4. Thereby, the material points of the side surfaces 19 and 20 move on the trajectories shown in illustration 33. It can be seen here that the maximum vibration amplitudes occur in the central sections (i.e. at L/2) of the side surfaces 19, i.e. the maxima of the vibration velocities of the material points of the side surfaces 19. The minimum vibration amplitudes, i.e. the minima of the vibration velocities, are located at a distance of about ¼ L from the side surfaces 20. The minimum vibration amplitudes or the minimum vibration velocities of the material points of the side surfaces 20 are located in the central sections (i.e. at B/2) of the side surfaces 20. Since the friction element 3 is arranged at the maximum of the vibration velocities of the side surface 19, it moves along a maximum linear trajectory and thereby transmits the maximum driving force to the element to be driven 4, and thus, actuates the element to be driven 4. If two acoustic standing waves are generated in actuator 1, the trajectory of the material points of the surfaces 19 and 20 can have the shape of an ellipse.

Figure 5:
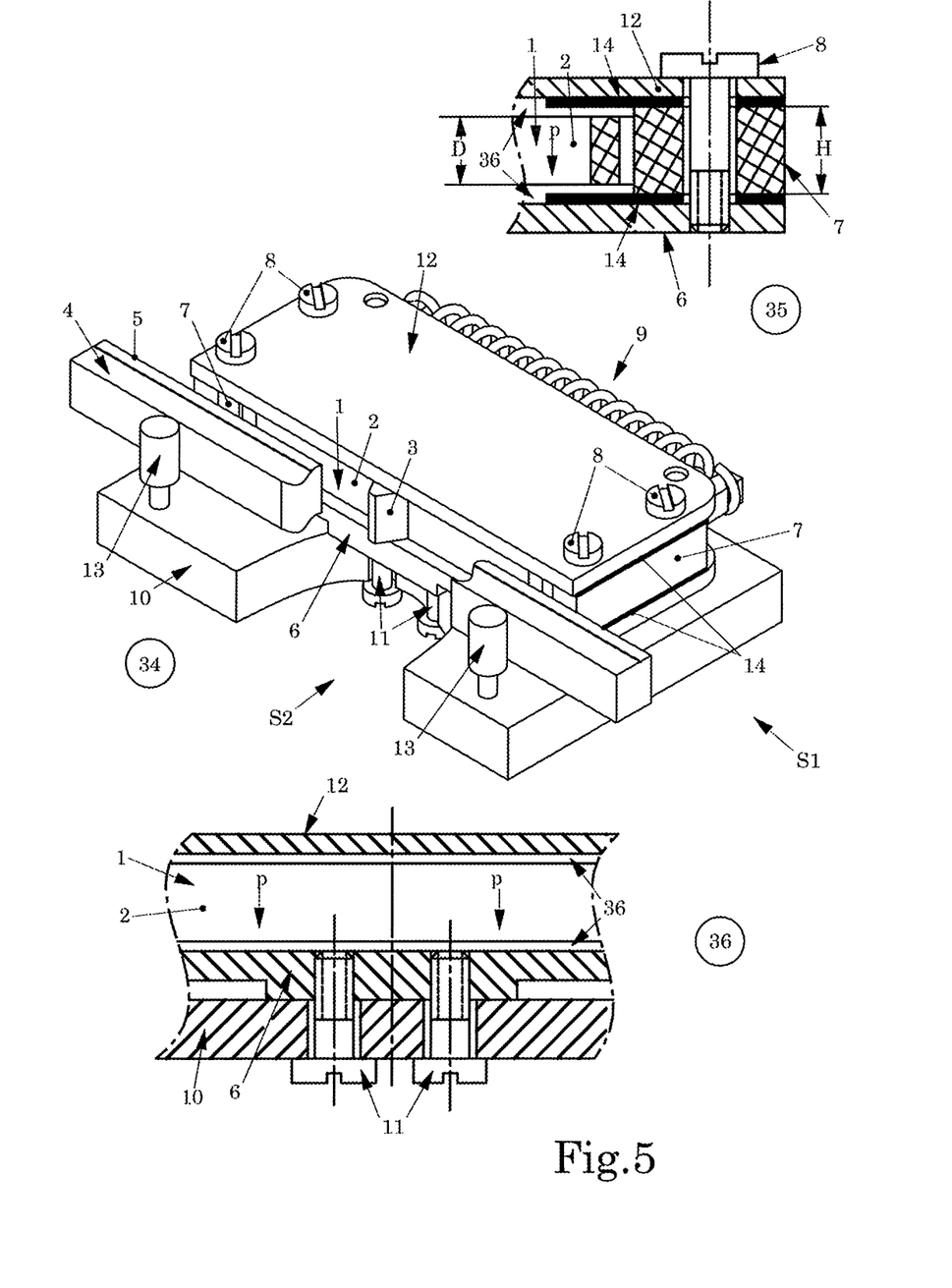
FIG. 5: illustration 34: ultrasonic motor according to FIG. 1 in the assembled state; illustration 35: section through the ultrasonic motor according to illustration 34 at a first position; illustration 36: section through the ultrasonic motor as shown in illustration 34 at a second position

Illustration 34 of FIG. 5 shows the ultrasonic motor according to FIG. 1 in assembled form. Illustration 35 of FIG. 5 shows a section through parts of the motor at the height of the screws 8 in a plane perpendicular to the direction S1. The screws 6 press the abutting sections 7 against the peripheral sides of the thermo-compensation platform 6. The height H of the abutting sections 7 is approximately 0.2 to 0.3 mm greater than the thickness D of the piezo-electric plate 2. As a result, distances 36 are created both between the plate 2 and the platform 6 and between the plate 2 and the cover 12. These distances 36 enable the screws 8 to fix the abutting sections 7 without clamping the plate 2 between the platform 6 and the cover 12. Illustration 36 of FIG. 5 shows a section through parts of the motor at the height of the screws of the fastening elements 11 in the plane perpendicular to the direction S2. The fastening elements 11 are located in the central section of the thermo-compensation platform 6 and serve to fix the motor on the housing 10 or on an apparatus. Threaded holes and screws, non-threaded holes and pins or other suitable fastening elements can be used as fastening elements.

Figure 6:
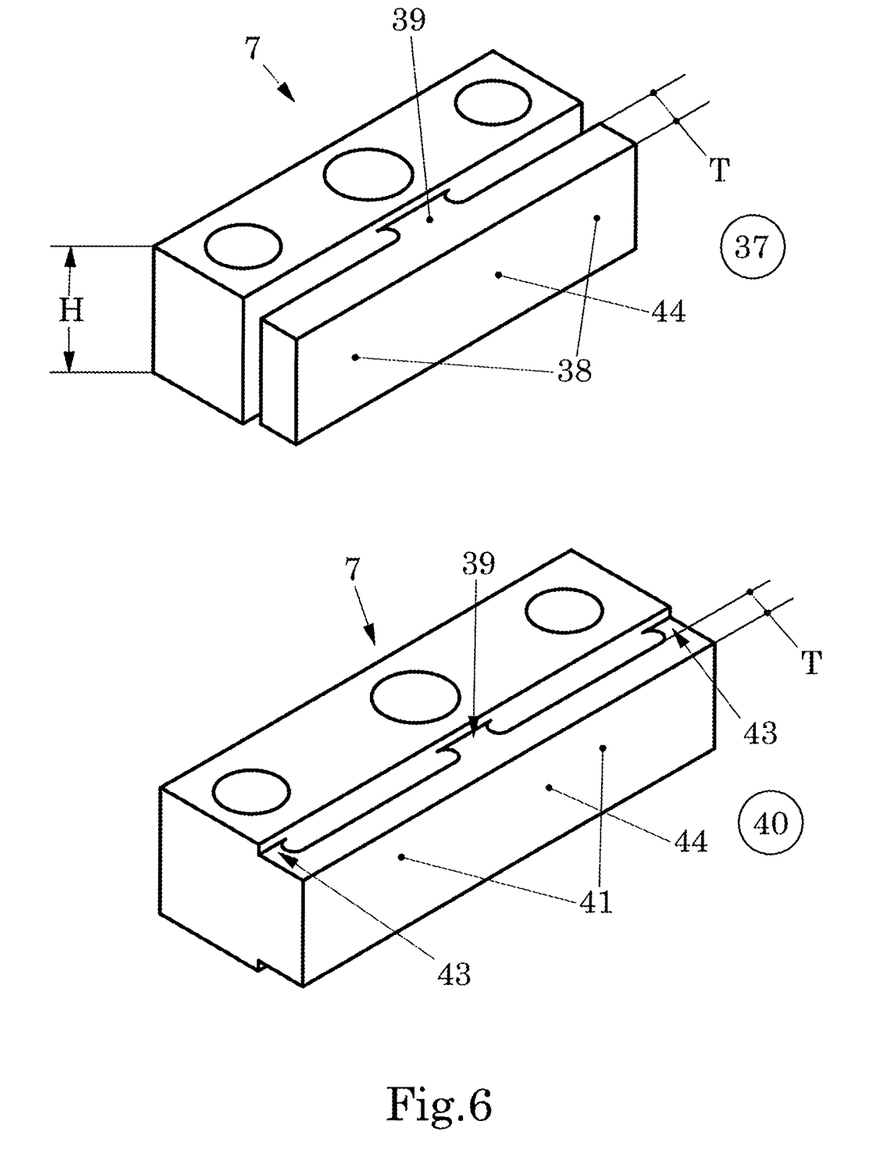
FIG. 6: illustrations 37 and 40: embodiments of an abutting section of an ultrasonic motor according to the invention

Illustration 37 of FIG. 6 shows a possible embodiment of an abutting section 7, said abutting section having a base section with through-holes and wing sections 38, which are connected integrally or in one piece to the base section via a common connecting web 39. The wing sections 38 are therefore only fixed on one side and have a free and not mounted distal section. A sliding surface 44 is arranged on the wing sections 38.

Illustration 40 of FIG. 6 shows a further possible embodiment of an abutting section 7 having a base section identical to Illustration 37 of FIG. 6, to which two wall sections 41 are connected integrally or in one piece via a connecting web 39 and two fastening webs 43. In contrast to the wing sections 38, the wall sections 41 therefore have no free or non-mounted sections as shown in illustration 37 of FIG. 6. A sliding surface 44 is also arranged on the wall sections 41.

When mounting the motor, the abutting sections 7 with their sliding surfaces 44 are pressed against the front surfaces of the piezo-electric plate 2 in order to eliminate the distances between the surfaces 20 and 44. Subsequently, the abutting sections 7 are fixed on the platform 6 with the screws 8 in such a way that the connecting web 39 comes to rest in the area of the side surfaces 20 of the plate 2, where during operation the minima of the vibration velocities of the side faces 20 are formed due to the deformation vibrations excited in the actuator. The actuator 1, which is oscillated during operation, in turn oscillates the wing sections 38 and the wall sections 44 with its side surfaces 20.

Figure 7:
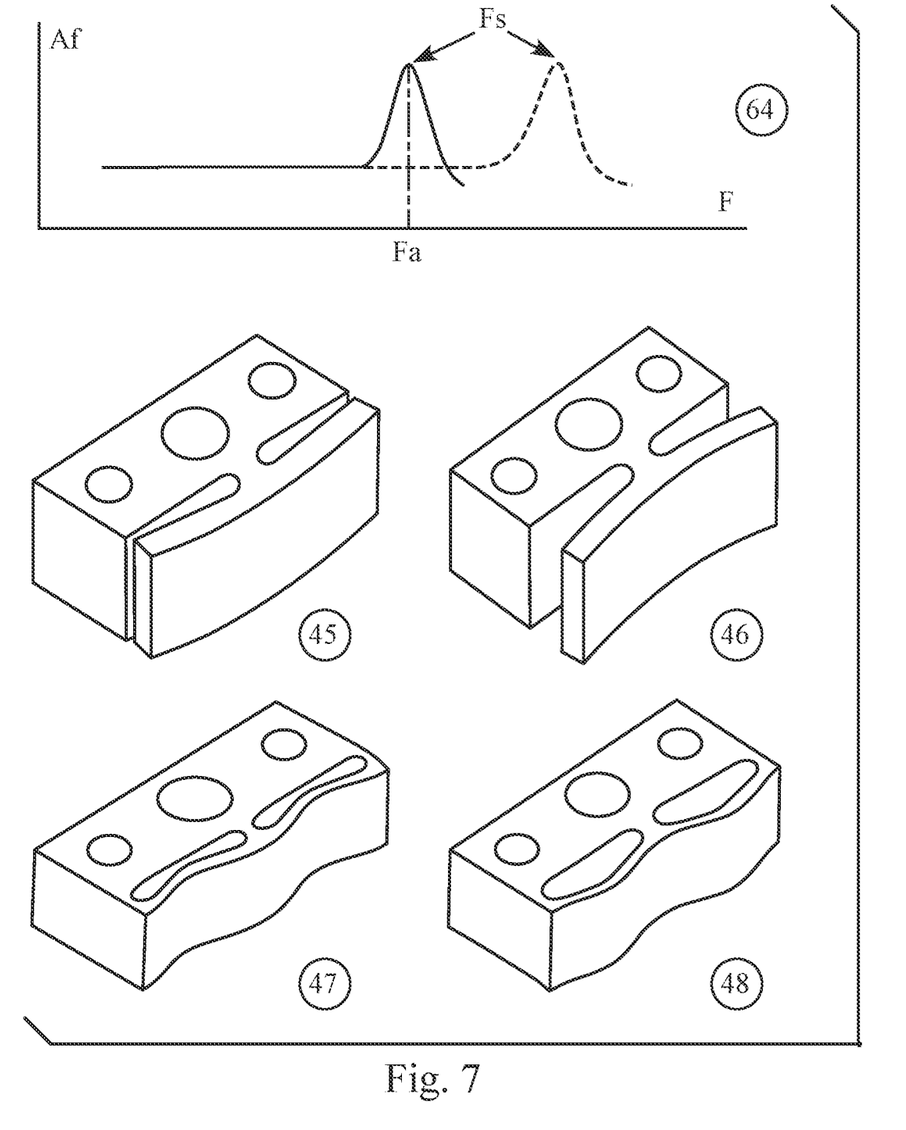
FIG. 7: illustration 64: position of the resonant frequency Fs of the first mode of the bending vibrations of the wing sections or the wall sections in comparison with the operating frequency Fa of the actuator; illustrations 45 and 46: calculated deformations of the wing sections of the abutting section according to illustration 37; illustrations 47 and 48: calculated deformations of the wall section of the abutting section according to illustration 40

The thickness T of the wing sections 38 or the wall sections 41 is selected such that the resonant frequency Fs of the first mode of the bending vibrations of the wing sections 38 or the wall sections 41 is equal to or greater than the operating frequency Fa of the actuator 1, as shown in illustration 64 of FIG. 7, where Af is the vibration amplitude of the wing sections 38 or the wall sections 41. The wing sections 38 or the wall sections 41 vibrate as shown in illustrations 45 to 48 of FIG. 7.

Figure 8:
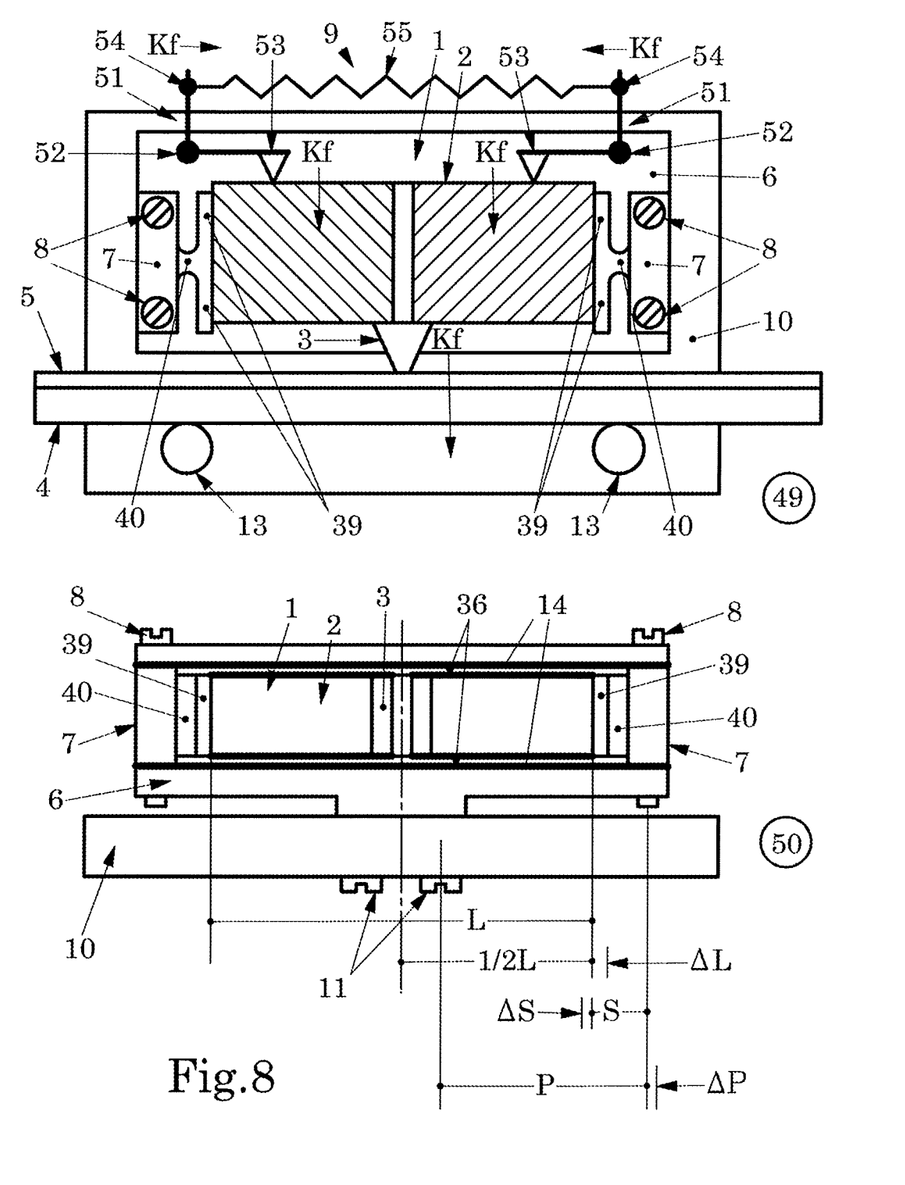
FIG. 8: illustration 49: schematic diagram of an ultrasonic motor according to the invention in a side view to illustrate the contact forces acting on the actuator; illustration 50: top view of the ultrasonic motor according to illustration 49 to illustrate the thermal expansion of its parts

Illustration 49 of FIG. 8 corresponds to a schematic diagram of an ultrasonic motor according to the invention in side view to illustrate the contact forces acting on the actuator, while illustration 50 of FIG. 8 corresponds to a top view of the ultrasonic motor according to illustration 49 to illustrate the thermal expansion of its parts. The friction element 3 arranged on the actuator 1 is pressed against the friction layer 5 of the element to be driven 4 via the tensioning device 9 which comprises two rotation angle levers 51 mounted on the axes 52. Each rotation angle lever 51 has a pressure lever arm 53 and a tension lever arm 54. The pressure lever arms 53 are in contact with the side surface 9 of actuator 1 in the area where a minimum of deformation vibration velocities occurs during operation of the actuator. The two equally large forces Kf generated by the tension spring 55 and directed in opposite directions act on the tension lever arms 54. The force Kf acting on each tension lever arm generates a torque in the respective angle of the rotation lever, which is why each pressure lever arm acts with a defined force on the side surface 19 of the actuator 1 due to the rotatable mounting of the angle of the rotation lever.

The spring 55 with the tensile force Kd=2 Kf presses the actuator 1 or the friction element 3 against the friction surface 5 of the element to be driven 4. The contact force Kd thereby is composed of two forces Kf of equal magnitude. The peculiarity of the tensioning device 9 of the ultrasonic motor according to the invention is that the forces Kf are always the same. This effectively prevents the actuator 1 from tilting between the abutting sections 7.

Due to the bending vibrations generated during operation in the wing sections 38 or in the wall sections 41 of the abutting sections 7, the friction force between the respective sliding surface 44 and the respective front surface 20 of actuator 1 is considerably reduced. Therefore, the actuator 1 with its friction element 3 can move freely perpendicular to the friction layer 5. Since the connecting webs 39 and the fastening webs 43 are located in the areas of the vibration velocity minimum of the side surfaces 20 of the vibrating actuator 1, the acoustic load on the actuator 1 is significantly reduced on the part of the abutting sections 7. The abutting sections 7 reliably prevent the actuator 1 from moving parallel to the friction layer 5. This significantly increases the positioning accuracy of the element to be driven 4.

If the actuator 1 heats up, either due to the operation of the ultrasonic motor itself or due to an increase in the ambient temperature, the actuator 1, the abutting sections 7, and the thermo-compensation platform 6 expand. The temperature-related expansion of the actuator by half the length L is identified with $\Delta L$, that of the width S of the abutting sections 7 with $\Delta S$ and that of the length P of the platform 6 with $\Delta P$ (see illustration 50 of FIG. 8). The thermal expansions $\Delta L$ and $\Delta S$ occur in two opposite directions and therefore cause compression of the actuator 1 between the two abutting sections 7 without a countermeasure. Since the thermo-compensation platform 6 is held in its central area and the abutting sections 7 are fastened to their peripheral areas, the temperature expansion $\Delta P$ of the platform 6 is partially or completely compensated by the temperature expansion $\Delta S$ of the abutting sections 7. For a complete compensation or for a complete prevention of the compression of the actuator 1, the condition $\Delta P = \Delta L + \Delta S$ must be observed. With the observance of this condition, there will be no compression of the actuator 1, neither with an increase nor with a decrease of the temperature. In order to maintain the indicated ratio, it is necessary to select the length P of the platform 6 taking into account the thermal expansion coefficients of the thermo-compensation platform 6, of the actuator 1 and of the abutting sections 7.

Figure 9:
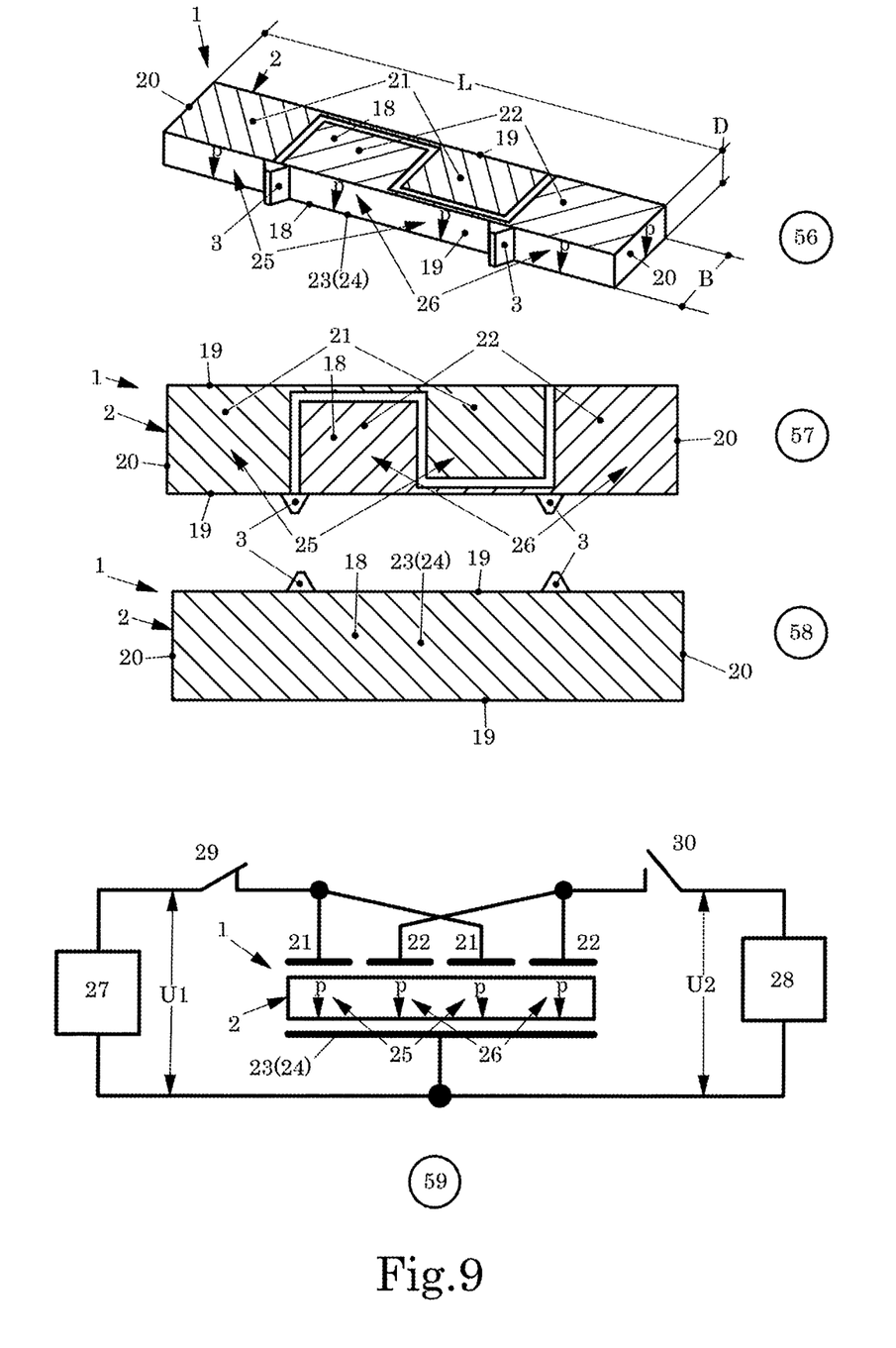
FIG. 9: illustration 56: perspective view of an embodiment of an actuator of an ultrasonic motor according to the invention; illustration 57: front side view of an actuator according to illustration 56; illustration 58: rear side view of the actuator according to illustration 56; illustration 59: block diagram to illustrate a possible connection of the actuator according to illustrations 56 to 58 in an ultrasonic motor according to the invention with an electric excitation device

Illustration 56 of FIG. 9 shows in perspective view the structure of an actuator 1 of an ultrasonic motor according to the invention with double length L in which the fourth mode of an acoustic standing wave is generated. Illustrations 57 and 58 show the front and rear sides of the actuator 1 according to illustration 56. Illustration 59 of FIG. 9 shows a block diagram concerning a possible connection/control of the actuator 1 according to illustrations 56 to 58 with an electric excitation device which causes the formation of an acoustic wave in it.

Figure 10:
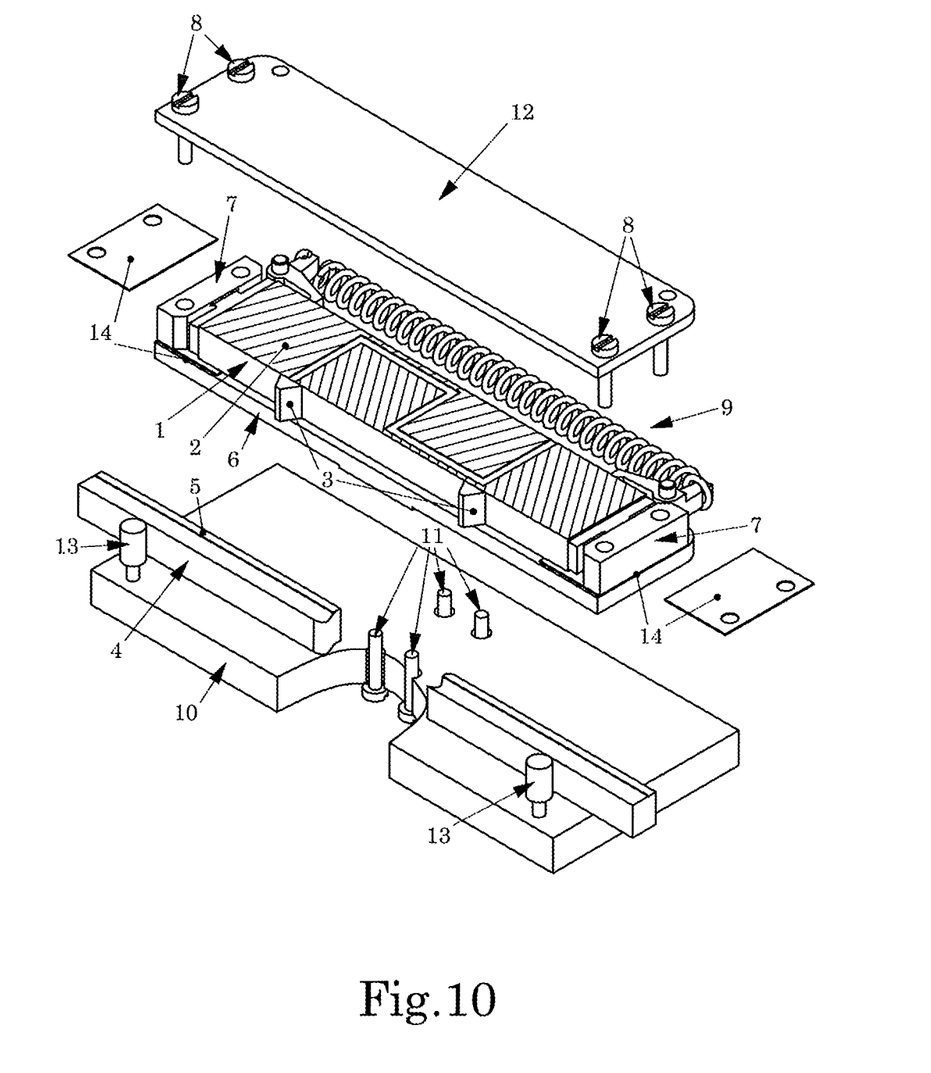
FIG. 10: exploded view of an ultrasonic motor according to the invention with an actuator according to FIG. 9

FIG. 10 shows an exploded view of an embodiment of the ultrasonic motor according to the invention with the actuator according to FIG. 9.

Figure 11:
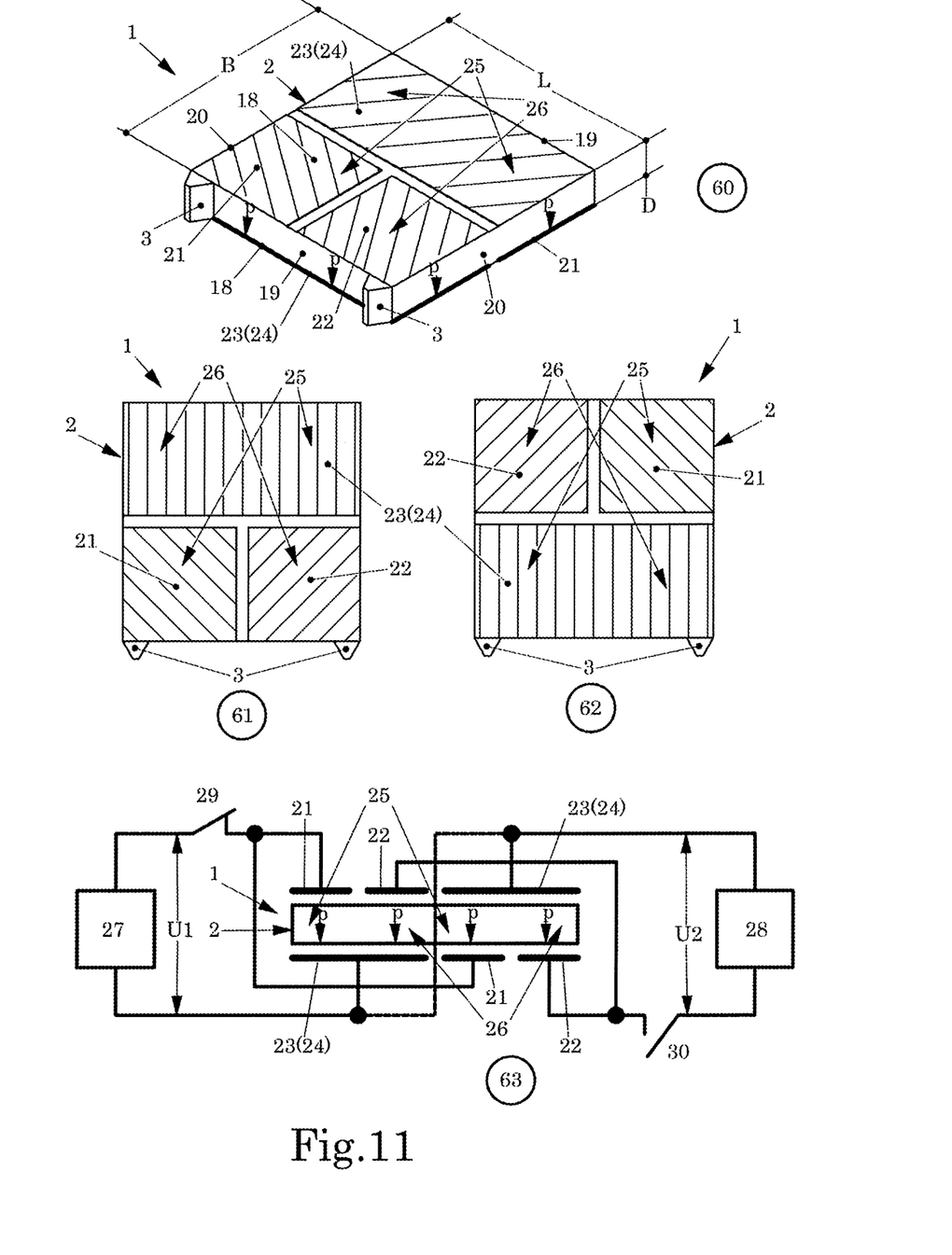
FIG. 11: illustration 60: perspective view of an embodiment of an actuator of an ultrasonic motor according to the invention; illustration 61: front side view of an actuator according to illustration 60; illustration 62: rear side view of the actuator according to illustration 60; illustration 63: block diagram to illustrate a possible connection of the actuator according to illustrations 60 to 62 in an ultrasonic motor according to the invention with an electric excitation device

Illustration 60 of FIG. 11 shows a further embodiment of an actuator 1 of an ultrasonic motor according to the invention in perspective view. The actuator thereby has the shape of a square piezo-electric plate 2, wherein the length L of the piezo-electric plate 2 is equal to or substantially equal to its width B. Illustrations 61 and 62 of FIG. 11 show the front and rear surfaces of the actuator 1 according to illustration 60 of FIG. 11. Illustration 63 of FIG. 11 shows the block diagram for a possible connection or control of the actuator 1 according to illustrations 60 to 62 with an electric excitation device. In the square actuator, either the second mode of a diagonal wave along a diagonal of the piezo-electric plate 2 is thereby excited, or two diagonal acoustic waves are generated along the two diagonals of the square plate 2.

Figure 12:
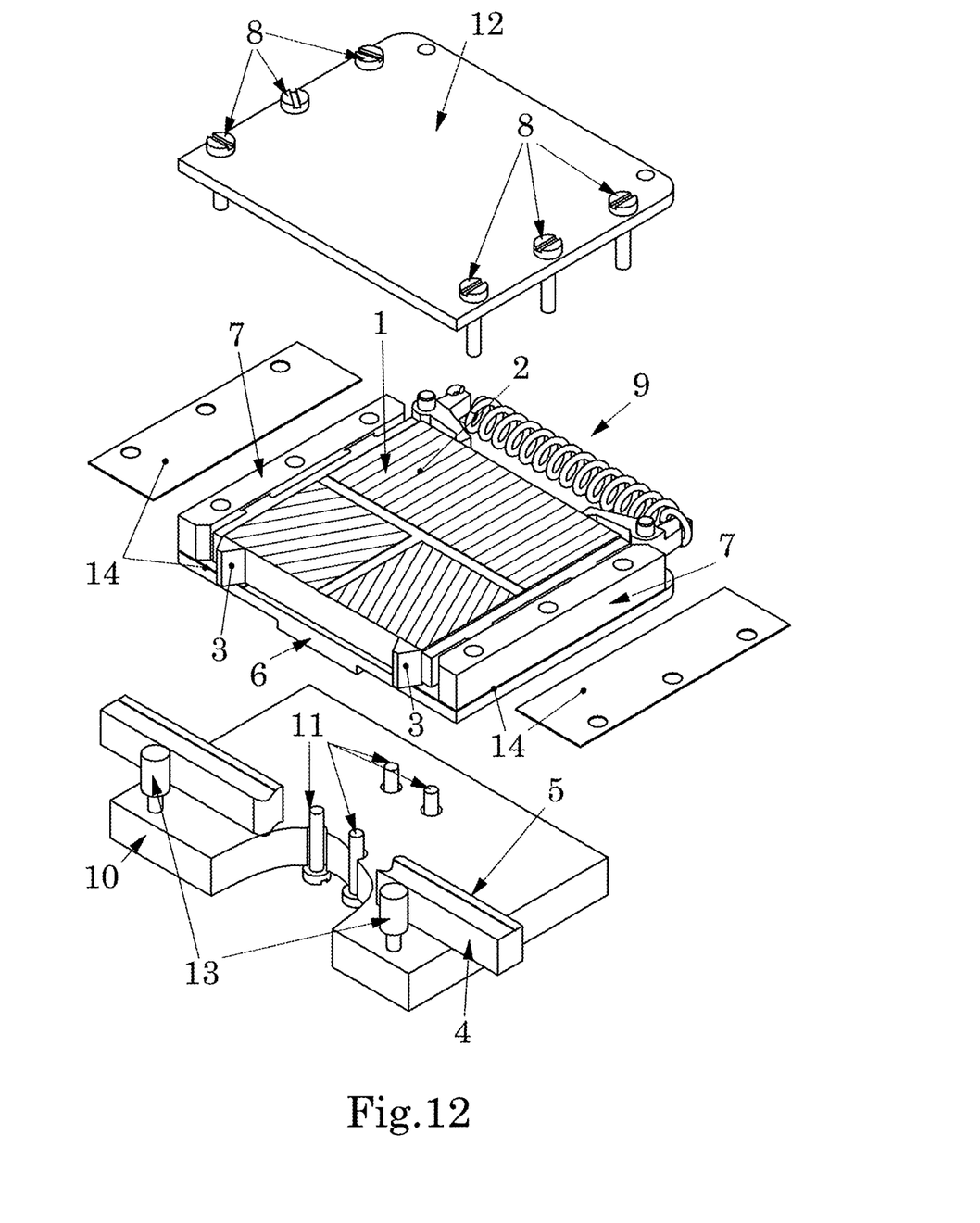
FIG. 12: exploded view of an ultrasonic motor according to the invention with an actuator according to FIG. 11

FIG. 12 shows an embodiment of the ultrasonic motor according to the invention in an exploded view with the actuator according to FIG. 11.

The invention claimed is:

1. An ultrasonic motor, comprising:
   an actuator formed as a piezo-electric plate with two main surfaces and at least four side surfaces connecting the main surfaces with one another, each main surface having a surface area larger than that of a side surface;
   at least one friction element arranged on at least one of the side surfaces;
   an element to be driven which is in active contact with the friction element of the actuator to be driven via the friction element;
   a tensioning device for pressing the at least one friction element against the element to be driven; and
   a thermo-compensation platform having abutting sections against which side surfaces of the actuator abut so that a displacement of the actuator is only possible along the side surfaces which abut against the abutting sections, wherein the tensioning device includes:
   two rotation angle levers, wherein each rotation angle lever includes one tension lever arm and one pressure lever arm, and wherein the tension lever arms are connected to one another via a tensioned tension spring, and a tensile force of the tension spring is selected to exert a torque on the rotation angle lever such that each of the pressure lever arms will act with a defined force on a side surface of the actuator which is opposite to the side surface on which the at least one friction element is arranged so that the actuator will be pressed along the abutting sections to be linearly guided by them in a direction of the element to be driven.

2. The ultrasonic motor according to claim 1, wherein a length of the thermo-compensation platform and its material are selected such that its temperature-related change in length is equal to a sum of a temperature-related change in length of the piezo-electric plate and a temperature-related change in width of the abutting sections so that the actuator will be substantially free of externally applied compression forces when temperature changes.

3. The ultrasonic motor according to claim 1, wherein each of the abutting sections comprises:
   one base section; and
   two wing sections, each with a free end, against which the actuator abuts with its corresponding side surface, wherein the wing sections are connected to the base section via a connecting web, and a fastening web.

4. The ultrasonic motor according to claim 1, wherein each of the abutting sections has comprises:
   a base section; and
   two wall sections against which the actuator abuts with its corresponding side surface, wherein each of the wall sections is connected to the base section via at least one connecting web, and a fastening web.

5. The ultrasonic motor according to claim 3, wherein a resonant frequency Fs of at least one wing section is equal to or greater than an operating frequency Fa of the actuator.

6. The ultrasonic motor according to claim 3, wherein the actuator is arranged with respect to the abutting sections such that each connecting web each fastening web is located in a range of a respective velocity minimum of deformation vibrations generated on a respective side surface of the actuator during operation.

7. The ultrasonic motor according to claim 1, wherein the actuator is arranged with respect to the rotation angle levers such that a respective point of contact between one of the pressure lever arms and the actuator is in a range of a respective velocity minimum of deformation vibrations generated on a respective side surface of the actuator during operation.

8. The ultrasonic motor according to claim 2, wherein each of the abutting sections comprises:
   one base section; and
   two wing sections, each with a free end, against which the actuator abuts with its corresponding side surface, wherein the wing sections are connected to the base section via a connecting web.

9. The ultrasonic motor according to claim 2, wherein each of the abutting sections comprises:
   one base section; and
   two wing sections, each with a free end, against which the actuator abuts with its corresponding side surface, wherein the wing sections are connected to the base section via a common connecting web and a fastening web.

10. The ultrasonic motor according to claim 2, wherein each of the abutting sections comprises:
    a base section; and
    two wall sections against which the actuator abuts with its corresponding side surface, wherein each of the wall sections is connected to the base section via at least one connecting web.

11. The ultrasonic motor according to claim 8, wherein a resonant frequency Fs of at least one wing section is equal to or greater than an operating frequency Fa of the actuator.

12. The ultrasonic motor according to claim 10, wherein a resonant frequency Fs of at least one wall section is equal to or greater than an operating frequency Fa of the actuator.

13. The ultrasonic motor according to claim 4, wherein the actuator is arranged with respect to the abutting sections such that each connecting web or each fastening web is located in a range of a respective velocity minimum of deformation vibrations generated on a respective side surface of the actuator during operation.

14. The ultrasonic motor according to claim 5, wherein the actuator is arranged with respect to the abutting sections such that each connecting web or each fastening web is located in a range of a respective velocity minimum of deformation vibrations generated on a respective side surface of the actuator during operation.

15. The ultrasonic motor according to claim 13, wherein the actuator is arranged with respect to the rotation angle levers such that a respective point of contact between one of the pressure lever arms and the actuator is in a range of a respective velocity minimum of deformation vibrations generated on a respective side surface of the actuator during operation.

16. The ultrasonic motor according to claim 14, wherein the actuator is arranged with respect to the rotation angle levers such that a respective point of contact between one of the pressure lever arms and the actuator is in a range of a respective velocity minimum of deformation vibrations generated on a respective side surface of the actuator during operation.

17. The ultrasound motor according to claim 4, wherein the connecting web is a common connecting web.

* * * * *